(12) United States Patent
Babella et al.

(10) Patent No.: US 6,650,136 B2
(45) Date of Patent: Nov. 18, 2003

(54) METHOD AND APPARATUS TO ENHANCE TESTABILITY OF LOGIC COUPLED TO IO BUFFERS

(75) Inventors: Anthony Babella, Salida, CA (US); Kapila B. Udawatta, Folsom, CA (US); Razi Uddin, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/788,127

(22) Filed: Feb. 16, 2001

(65) Prior Publication Data

US 2002/0113614 A1 Aug. 22, 2002

(51) Int. Cl.[7] ............................................... G01R 31/26
(52) U.S. Cl. ........................................................ 324/765
(58) Field of Search ............................ 324/73.1, 158.1, 324/763, 765; 326/63, 136; 365/201, 205; 714/726, 727, 734

(56) References Cited

U.S. PATENT DOCUMENTS

| | | | | |
|---|---|---|---|---|
| 5,528,610 A | * | 6/1996 | Edler et al. ............... | 324/158.1 |
| 5,631,911 A | * | 5/1997 | Whetsel, Jr. ............... | 324/73.1 |
| 5,671,234 A | * | 9/1997 | Phillips et al. ................ | 236/63 |
| 5,960,008 A | * | 9/1999 | Osawa et al. ................ | 365/201 |

* cited by examiner

Primary Examiner—Kamand Cuneo
Assistant Examiner—Minh N. Tang
(74) Attorney, Agent, or Firm—Blakely, Sokoloff, Taylor & Zafman LLP

(57) ABSTRACT

A circuit to analyze or test a first or second logic coupled to an input/output circuit by storing a plurality of signals into a plurality of flip flops. The flip flops store the plurality of signals for a first mode of operation to observe at least one node within the first logic. Also, the flip flops load data values in response to control logic for a second mode of operation to control at least one node within the second logic.

10 Claims, 1 Drawing Sheet

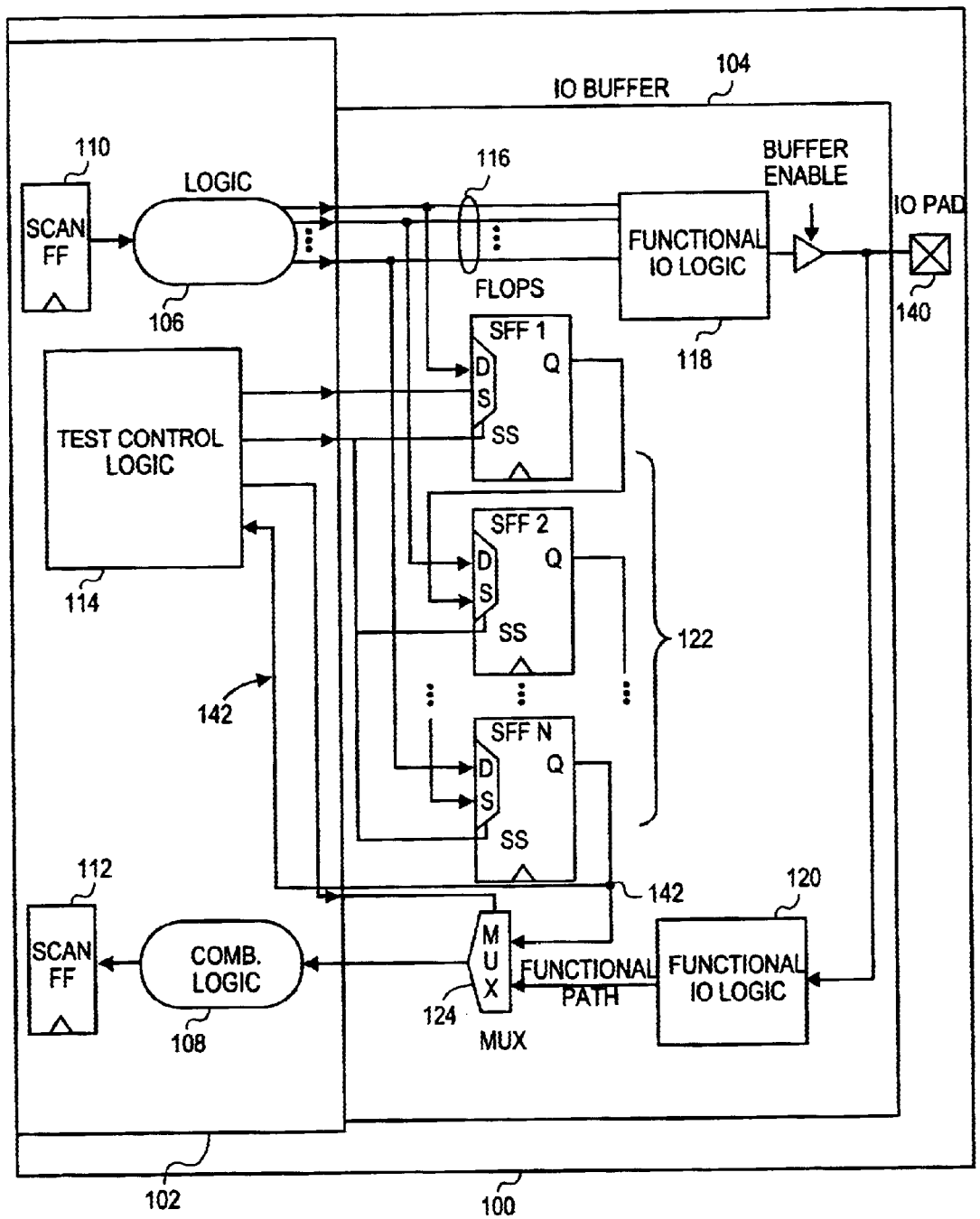

METHOD AND APPARATUS TO ENHANCE TESTABILITY OF LOGIC COUPLED TO IO BUFFERS

BACKGROUND OF THE INVENTION

1. Field of the Invention

The present invention relates to design for test improvements, and specifically to a method and apparatus for increased ability to observe and control logic nodes located between input/output buffers and a first set of flops within a core of the integrated device.

2. Description of the Related Art

As the technology for manufacturing integrated circuits advances, more logic functions are included in a single integrated circuit device. Modern integrated circuit (IC) devices include large numbers of gates on a single semiconductor chip, with these gates interconnected so as to perform multiple and complex functions. The fabrication of an IC incorporating such Very Large Scale Integration (VLSI) must be error free, as a manufacturing defect may prevent the IC from performing all of the functions that an IC is designed to perform. Such demands require verification of the design of the IC and also various types of electrical testing after the IC is manufactured.

However, as the complexity of the IC increases, so does the cost and complexity of verifying and electrically testing each of the devices in the IC. Electrical testing ensures that each node in a VLSI circuit functions properly. Therefore, each node needs to individually, and in conjunction with the other node in the IC, function properly in all possible combinations of operations. Typically, electrical testing is performed by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular node. For complex circuitry, this may involve a large number of test vectors and, accordingly, a long test time.

One way to address this problem is through design for test (DFT). The key concepts in DFT are controllability and observability. Controllability is the ability to set and reset the state of every node in the IC. Observability is the ability to observe either directly or indirectly the state of any node in the IC. The purpose of DFT is to increase the ability to control and observe internal and external nodes from external inputs/outputs.

DFT methods utilize various test circuits. One type of test circuit is a scan path or a scan loop in the logic circuit. A scan path or scan loop comprises of a chain of synchronously clocked master/slave latches (or registers), each of which is connected to a particular node in the logic circuit. Typical scan circuit designs involve two or more separate scan paths or scan loops. The scan latches can be loaded with a serial data stream of scan vectors that set the logic circuit nodes to a predetermined state. The logic circuit then can be operated in normal fashion and the result of the operation is stored in its respective latch. A scan out operation serially unloads the contents of the latches and the result of the test operation at the associated nodes is analyzed for improper node operation.

The load and scan out operations are performed via a test port. One example of a test port is a defined by the Institute of Electrical and Electronic Engineers(IEEE) is a Joint Test Action Group (JTAG) test protocols set forth in IEEE standard 1149.1. In such a system, a JTAG test device is connected to a pair of ICs or to a single IC. The JTAG device generates test commands for testing the ICs. Input and output of JTAG test commands is achieved through a set of JTAG-dedicated pins provided on each IC to be tested. Typically, the JTAG test device is employed to perform scan test. General information regarding JTAG and scan test strategies and implementations may be found in "Boundary-Scan Test, A Practical Approach", by Harry Bleeker, Peter Van Den Eijnden and Frans de Jong, Kluwer Academic publishers 1993.

Testing costs and complexity increase dramatically because of the increasing number of functional pins on the integrated devices. One solution for reducing test costs is to use test equipment with a capability to only test a limited number of pins with a limited number of test channels. However, testing and fault coverage suffers because of the inability to control and observe various logic nodes within the integrated device due to the lack of dedicated tester channels. Specifically, input/output buffers require a large number of tester channels and suffer from a lack of fault coverage because of a lack of observability and controllability for logic coupled to the input/output buffers.

BRIEF DESCRIPTION OF THE SEVERAL VIEWS OF THE DRAWINGS

The present invention is illustrated by way of example and not limitation in the following figures. Like references indicate similar elements, in which:

The sole FIGURE illustrates a block diagram utilized by an embodiment of the present invention.

DETAILED DESCRIPTION OF THE INVENTION

A method and apparatus to observe and control logic nodes located between input/output buffers and a first set of flops within a core of the integrated device are described. In the following description, for purposes of explanation, numerous details are set forth in order to provide a thorough understanding of the present invention. However, it will be apparent to one skilled in the art that these specific details are not required in order to practice the present invention.

The sole FIGURE illustrates a block diagram 100 utilized by an embodiment of the present invention. The block diagram 100 comprises a logic block 102 and an input/output buffer block 104 of an integrated device. In one embodiment, the logic block 102 and the input/output buffer 104 reside on the same integrated device. The logic block 102 comprises combinational logic 106 and 108, flip flops 110 and 112 and control logic 114. The input/output buffer receives as input a plurality of signals 116 from the logic block 102 via the combinational logic 106. The input/output buffer comprises IO logic 118 and 120 to send and receive data via an IO pad 140. Also, in one embodiment the input/output buffer comprises a plurality of flip flops 122 and a multiplexer 124. In another embodiment, the plurality of flip flops 122 are not in the input/output buffer, but are coupled to the input/output buffer. The input/output buffer forwards data to the combinational logic block 108 via the multiplexer 124.

In one embodiment, the logic block 102 processes various commands and calculations and the input/output buffer transmits and receives data and commands via the 10 pad. The plurality of input signals 116 to the input/output buffer 104 from the logic block 102 is coupled to the plurality of flip flops 122(SFF1-SFFn). Each flip flop 122 has a data input (DI), a scan in (SI) input, a scan select control (SS) input, and an output, Q. In one embodiment, each input signal 116 is coupled to a single data input of the flip flops 122. In another embodiment, a subset of input signals is coupled to a single data input of the flip flops 122. An output, Q, of the first flip flop (SFF1) 122 is coupled to the scan input of the second flip flop (SFF2) 122. Each successive scan input of a flip flop 122 is connected to the output, Q, of the preceding flip flop 122. Thus, the plurality of flip flops 122 forms a scan chain. In one embodiment, the output, Q, of flip flop (SFFn) 122 is connected to one input of a multiplexer 124 and to the control logic 114. In another embodiment, a plurality of multiplexers 124 are individually connected to one of an output of the flip flops 122 and the outputs of the multiplexers are connected to various nodes within the combinational logic 108.

The control logic 114 enables and supervises the operation of the flip flops 122. The control logic 114 asserts the scan select (SS) to determine which input, either the data input or the scan input, the flip flop 122 should receive. Also, the control logic 114 forwards the value for the scan input of each flip flop 122. However, the data input of each flip flop 122 is received from the plurality of signals 116. The flip flops 122 form a scan chain and the control logic observes the values stored in the flip flops 122 since the output, Q, of the last flip flop 122 is coupled to the control logic at node 142. In one embodiment, the control logic 114 resides on the integrated device and is capable of receiving control signals from an Automatic Test Equipment (ATE). In another embodiment, the control logic 114 resides on an external integrated device, or in software, or on the ATE.

During normal operation of the integrated device, the flip flops 122 store the values of the plurality of signals 116, which the input/output buffer block 104 receives from the combinational logic 106. The control logic 114 has the ability to observe the values stored in the flip flops 122 via node 142. Due to the ability to observe the values stored in the flip flops 122, the detection of errors from the plurality of signals 116 are isolated because the value is stored in the flip flop 122. Thus, there is increased fault coverage of the logic nodes within the combinational logic 106.

During a scan operation of the integrated device, the scan input of the first flip flop 122 receives a data value from the control logic 114. Since the flip flops 122 are coupled in a scan chain, the remaining flip flops 122 receive at the scan input a data value from the preceding flip flop. In one embodiment, the control logic 114 determines the plurality of input values to store in the flip flops 122 in order to control a plurality of logic nodes within the combinational logic 108. In yet another embodiment, logic simulation software determines the values, which are forwarded to the control logic 114 via a package pin. The flip flops 122 stores the plurality of data values and the control logic 114 instructs the multiplexer 124 to select the input coupled to the output, Q, of the last flip flop 122 rather than the input from the functional 10 logic. Thus, the multiplexer forwards the data values from the flip flops 122 to the combinational logic 108. If one or more logic nodes within the combinational logic 108 have stuck at fault defect of a "0" value, the flip flops 122 can store a "1" value and the multiplexer 124 forwards the "1" value to the particular nodes in the combinational logic 108. The prior example was for a stuck at fault, however, the invention is capable of detecting any manufacturing defect because of the ability of controlling and observing the various logic nodes in block diagram 100. Thus, the fault coverage of the integrated device increases due to the controllability of the logic nodes within the combinational logic 108 via the flip flops 122. The controllability and observability features of the flip flops 122 can support the integrated device for a variety of modes of operation including Logic Bist (LBIST) and burn in mode for reliability.

The number of flip flops 122 can vary for each cell instance of the input/output buffer 104 or in response to a fault coverage or die area specification. In one embodiment, the number of flip flops 122 is equal to the number of signals 116 received in the input/output buffer 104 from the combinational logic 106. Also, each different cell instance of the input/output buffer 104 could have different numbers of flip flops 122. In another embodiment, the number of flip flops 122 is a subset of the number of signals 116 received in the input/output buffer 104 from the combinational logic 106. A designer selects a subset of signals 116 to store based on design priority, test coverage requirements, and die area requirements. For example, if some of the signals 116 are controlled or observed via other test methods or stored in other flip flops, the designer can decide not to store those signals in flip flops 122.

One skilled in the art would appreciate utilizing various embodiments. For example, the control logic 114 controls only a subset of the flip flops 122. Also, some of the flip flops 122 will only have a data input. In another embodiment, the control logic 114 loads new values into the flip flops 122 in response to a pre-determined series of data values observed in the flip flops 122. For example, a data value of all logic 1 values stored in the flip flops 122 is known to eventually result in an error condition, the control logic 114 asserts the scan input of the flip flops and loads in a series of data values to prevent the error condition. In yet another embodiment, the flip flops 122 observe and control logic nodes within combinational logic located on another integrated device or system.

While the invention has been described with reference to specific modes and embodiments, for ease of explanation and understanding, those skilled in the art will appreciate that the invention is not necessarily limited to the particular features shown herein, and that the invention may be practiced in a variety of ways that fall under the scope and spirit of this disclosure. The invention is, therefore, to be afforded the fullest allowable scope of the claims that follow.

What is claimed is:

1. An apparatus for analyzing an integrated device comprising:
   a first and a second logic;
   an input/output buffer circuit coupled to the first and second logic, to receive a plurality of signals from a plurality of logic nodes of the first logic;
   a plurality of flip flops to store the plurality of signals for a first mode of operation to observe at least one of the plurality of logic nodes within the first logic; and
   a control logic, coupled to the input/output buffer circuit, to enable the plurality of flip flops.

2. The apparatus of claim 1 further comprising the plurality of flip flops to load a plurality of data values in response to a second mode of operation to control at least one of a plurality of logic nodes within the second logic.

3. The apparatus of claim 1 wherein the first mode of operation is a normal mode of operation for the integrated device.

4. The apparatus of claim 1 wherein the first and second logic is between the input/output circuit and a functional core of the integrated device.

5. The apparatus of claim 2 wherein the second mode of operation is a scan mode of operation enabled by the control logic.

6. An apparatus for analyzing an integrated device comprising:

a first with a plurality of logic nodes and a second logic;

an input/output buffer circuit coupled to the first and second logic, to receive a plurality of signals from the second logic in a first mode of operation;

a control logic, coupled to the input/output buffer circuit, to load a plurality of flip flops with a plurality of data values in response to a second mode of operation to control at least one of the plurality of logic nodes within the first logic.

7. The apparatus of claim 6 wherein the input/output circuit comprises a plurality of flip flops store a subset of data values of the plurality of signals to allow an observation of at least one logic node within the second logic.

8. The apparatus of claim 6 wherein the first mode of operation is a normal mode of operation for the integrated device.

9. The apparatus of claim 6 wherein the first and second logic is between the input/output circuit and a functional core of the integrated device.

10. The apparatus of claim 6 wherein the second mode of operation is a scan mode of operation enabled by the control logic.

* * * * *

UNITED STATES PATENT AND TRADEMARK OFFICE
CERTIFICATE OF CORRECTION

PATENT NO. : 6,650,136 B2 Page 1 of 1
DATED : November 18, 2003
INVENTOR(S) : Babella et al.

It is certified that error appears in the above-identified patent and that said Letters Patent is hereby corrected as shown below:

Column 2,
Line 65, delete "10", insert -- IO --.

Column 3,
Line 57, delete "10", insert -- IO --.

Column 4,
Line 5, delete "bum", insert -- burn --.

Signed and Sealed this

Second Day of March, 2004

JON W. DUDAS
*Acting Director of the United States Patent and Trademark Office*